(12) United States Patent
Fukuda et al.

(10) Patent No.: US 7,000,565 B2
(45) Date of Patent: Feb. 21, 2006

(54) PLASMA SURFACE TREATMENT SYSTEM AND PLASMA SURFACE TREATMENT METHOD

(75) Inventors: Seiichi Fukuda, Kanagawa (JP); Seiji Samukawa, Miyagi (JP)

(73) Assignee: Sony Corporation, Tokyo (JP)

( * ) Notice: Subject to any disclaimer, the term of this patent is extended or adjusted under 35 U.S.C. 154(b) by 184 days.

(21) Appl. No.: 10/803,141

(22) Filed: Mar. 17, 2004

(65) Prior Publication Data
US 2004/0259380 A1    Dec. 23, 2004

(30) Foreign Application Priority Data
Mar. 26, 2003   (JP) ............................ P2003-084568

(51) Int. Cl.
*H01L 21/469*    (2006.01)
*C23C 14/32*    (2006.01)

(52) U.S. Cl. .................... 118/723 I; 438/776; 438/792; 250/231.41; 315/111.21; 315/111.01

(58) Field of Classification Search .................. None
See application file for complete search history.

(56) References Cited

U.S. PATENT DOCUMENTS 5,580,429 A * 12/1996 Chan et al. ............ 204/192.38
6,238,512 B1 * 5/2001 Li et al. ................ 156/345.43

* cited by examiner

*Primary Examiner*—Nikita Wells
(74) *Attorney, Agent, or Firm*—Sonnenschein, Nath & Rosenthal LLP (57) ABSTRACT

A plasma surface treatment system for irradiating a surface of a substrate to be treated with a nitrogen plasma excited by a high-frequency electric field to introduce nitrogen into the surface of the substrate comprises a pulse modulator for pulse modulation of the high-frequency electric field. By applying the high-frequency electric field in a pulsed form, it is possible to realize a nitriding by which the peak of nitrogen concentration is located at a shallower position and a desired nitrogen concentration can be obtained.

8 Claims, 10 Drawing Sheets

PLASMA SURFACE TREATMENT SYSTEM AND PLASMA SURFACE TREATMENT METHOD

RELATED APPLICATION DATA

The present application claims priority to Japanese Application(s) No(s). P2003-084568 filed Mar. 26, 2003, which application(s) is/are incorporated herein by reference to the extent permitted by law.

BACKGROUND OF THE INVENTION

The present invention relates to a plasma surface treatment system and a plasma surface treatment method, and particularly to a plasma surface treatment system and a plasma surface treatment method for introducing nitrogen into a surface of a substrate to be treated which is for use in production of a semiconductor device and which is provided with a silicon oxide film, a metallic oxide film or the like on the surface thereof.

MOS type silicon semiconductor devices have the problems as to scattering of the threshold voltage and as to suppression of the short channel effect, attendant on miniaturization of transistor structure. As a countermeasure against the problems, there have been developed surface channel type CMOS (Complimentary MOS) transistors having the so-called dual gate structure in which a gate electrode containing an N type impurity is used for the N channel MOS transistor and a gate electrode containing a P type impurity is used for the P channel MOS transistor.

Conventionally, the gate electrode on the PMOS side in a CMOS transistor having the dual gate structure has been produced by a method in which polycrystalline silicon is built up on a silicon oxide film to be a gate insulation film by a CVD process, and boron is introduced into the polycrystalline silicon by an ion implantation technique, followed by a heat treatment for activation.

Meanwhile, boron in the gate electrode on the PMOS side is instable against heat. Therefore, the heat applied during various thermal steps conducted after the formation of the gate electrode, such as a CVD process for forming a silicon nitride film and a source/drain activating anneal process, leads to the phenomenon in which boron in the gate electrode diffuses through the gate oxide film to the silicon substrate. This phenomenon is generally called "punch-through of boron". Due to the punch-through of boron, depletion occurs on the gate electrode side, causing a decrease in the driving current of the transistor. In addition, boron having diffused to the substrate, or the channel region, causes such problems as scattering of the threshold value and worsening of sub-threshold characteristics. In view of this, generally from the 0.18 $\mu$m rule generation on, a technique of subjecting the silicon oxide film constituting the gate oxide film to a nitriding treatment to convert the oxide film into an oxynitride film, thereby suppressing the punch-through of boron, has been introduced.

Conventionally, it has been an ordinary practice to perform the nitriding treatment by a heat treatment in a high-temperature gas atmosphere of nitrogen oxide (NO), dinitrogen oxide ($N_2O$), ammonia ($NH_3$) or the like. Besides, attendant on miniaturization of design rules, there has been proposed a technique of introducing nitrogen shallowly into an extremely thin silicon oxide film by use of plasma composed mainly of nitrogen ($N_2$) gas which is excited by a high-frequency electric field (see, for example, Japanese Patent Application No. 2002-1051 (page 4, FIG. 1)). The plasma nitriding treatment consists in generating a nitrogen-containing plasma to perform plasma nitriding of the silicon oxide film for 5 min under the conditions of a flow rate of nitrogen in the treating atmosphere of 200 $cm^3$/min, a treating atmosphere pressure of 10 Pa, a substrate temperature of 600° C., and an RF power of 500 W.

It has been elucidated, through concentration measurement by secondary-ion mass spectrometry (SIMS) or the like, that nitrogen introduced into the silicon oxide film by a heat treatment or a plasma is normally present in the silicon oxynitride film formed and in the silicon substrate, with a nitrogen concentration peak at the interface between the silicon oxynitride film and the silicon substrate.

However, the nitrogen atoms introduced into the silicon substrate, or the channel forming regions, act as fixed electric charges and constitute a cause of scattering of the carriers, thereby deteriorating the mobility of the carriers. In addition, it has been pointed out that nitrogen present in the gate insulation film on the side of the interface with the silicon substrate has a great relation with the generation of NBTI (Negative Bias Temperature Instability) which has been becoming an important problem in recent years, particularly in miniaturized PMOS transistors. In order to solve this problem, it is necessary to lower, as much as possible, the concentration of nitrogen present in the channel regions and in the film near the interface with the silicon substrate. Namely, there is a request for a technology of implanting nitrogen into an extremely thin silicon oxide film in a desired concentration and to a desired depth, thereby forming a silicon oxynitride film with good controllability.

Meanwhile, it is easier to convert Si—Si and Si—H bonds into Si—N bonds than to convert Si—O bonds into Si—N bonds, on the basis of reactional energy. Upon a heat treatment in a high-temperature gas atmosphere of nitrogen oxide (NO), dinitrogen oxide ($N_2O$), ammonia ($NH_3$) or the like, nitrogen is concentrated in the channels and at the interface with the substrate. The reason is as follows. Since many Si—Si and Si—H bonds are present not only in the substrate but also in the so-called structure transition regions present in the silicon oxide film near the interface with the substrate, utilization of the heat treatment reaction causes a diffusion reaction, through which nitrogen reaches these regions to generate the Si—N bonds.

On the other hand, in the case of nitriding by a plasma using a high-frequency electric field which has been vigorously investigated in recent years, the diffusion reaction inevitable in the case of nitriding by use of the heat treatment reaction is suppressed greatly; therefore, the plasma nitriding shows a certain effect as means for lowering the nitrogen concentration in the channels and at the substrate interface. Unlike the diffusion phenomenon and the ion implantation technique, however, the plasma nitriding technique has the problem that the control method by an external input has not been fully elucidated and it is very difficult to control the output results. Therefore, in the case of nitriding an insulation film by use of plasma, rules of thumb by the workers in the art and much try-and-error activity are needed to obtain a desired nitrogen concentration and a desired nitrogen concentration gradient in the insulation film.

SUMMARY OF THE INVENTION

It is an object of the present invention to provide a plasma surface treatment system and a plasma surface treatment method for solving the above problems. It is another object of the present invention to obtain a desired nitrogen concentration and a desired nitrogen concentration gradient in an insulation film with good controllability, in nitriding by use of plasma generated by a high-frequency electric field.

In accordance with one aspect of the present invention, there is provided a plasma surface treatment system for irradiating a surface of a substrate to be treated with nitrogen plasma excited by a high-frequency electric field to introduce nitrogen into the surface of the substrate. The system includes a pulse modulator for pulse modulation of the high-frequency electric field.

The plasma surface treatment system includes the pulse modulator for pulse modulation of the high-frequency electric field, whereby dissociation and excitation of the nitrogen gas in the plasma are promoted during the application of the high-frequency electric field pulse-modulated by the pulse modulator. Therefore, by controlling the high-frequency electric field application time and the high-frequency electric field stop time during the pulse modulation with high accuracy, it is possible to control the dissociated and excited conditions of the nitrogen gas and, as a result, the concentration distribution of the nitrogen atoms implanted into an insulation film is controlled.

The pulse modulator is a pulse modulator capable of controlling the high-frequency electric field application time at the time of pulse modulation of the high-frequency electric field. Therefore, by controlling the high-frequency electric field application time through pulse modulation of the plasma-generating high-frequency electric field, it is possible to control the ratios of amounts of nitrogen molecules, atom-form nitrogen radicals and ions during implantation of nitrogen into the insulation film, and to control with high accuracy the reaction energy at the insulation film extreme surface given to the particles. Specifically, during the application of the high-frequency electric field through pulse modulation, the nitrogen molecules are dissociated into atomic form in the plasma, and the particles are supplied with such an energy as to be implanted into the insulation film extreme surface and to perform a reaction. Besides, by controlling with high accuracy the application time of the high-frequency electric field through pulse modulation, it is possible to control the ratio between the amounts of nitrogen molecules and nitrogen atoms. Therefore, the nitriding reaction with the insulation film at the insulation film extreme surface can be controlled with high accuracy, by controlling the application time of the high-frequency electric field through pulse modulation.

In addition, the pulse modulator is a pulse modulator capable of controlling the high-frequency electric field stop time at the time of pulse modulation of the high-frequency electric field. Therefore, by controlling the high-frequency electric field stop time through pulse modulation of the plasma-generating high-frequency electric field, the potential of the plasma generated by the high-frequency electric field can be controlled to a lower energy, as compared with that in the case of continuous discharge. Since the plasma potential acts as an energy for implantation of nitrogen molecules and nitrogen atoms into the insulation film, by controlling the high-frequency electric field stop time it is possible to control with high accuracy the depth of the nitriding reaction at the insulation film extreme surface.

An electrode having apertures for mitigating vacuum ultraviolet rays may be provided between the nitrogen plasma excited by the high-frequency electric field and the substrate to be treated. In this arrangement, the electrode having a multiplicity of apertures is provided between the plasma generated by the high-frequency electric field and the substrate to be treated, so that the nitrogen molecules and nitrogen atoms generated in the plasma pass through the apertures of the electrode to reach the substrate to be treated. The electrode provided between the substrate to be treated and the plasma mitigates the vacuum ultraviolet rays radiated onto the insulation film, thereby alleviating the damage to the insulation film by the vacuum ultraviolet rays. Therefore, regarding the nitriding reaction at the insulation film extreme surface, the implantation characteristic of the particles in the insulation film can be determined by the reaction energy of the particles. Besides, when the charged particles pass through the apertures of the electrode, the charged particles such as ions are neutralized through an interaction with the apertures. Therefore, the ions are not accelerated in a sheath at the substrate surface, and the particles having an excessive kinetic energy can be prevented from being implanted into the insulation film.

In accordance with another aspect of the present invention, there is provided a plasma surface treatment method for irradiating a surface of a substrate to be treated with a nitrogen plasma excited by a high-frequency electric field to introduce nitrogen into the surface of the substrate. A high-frequency electric field undergoing pulse modulation is used as the high-frequency electric field.

In the plasma surface treatment method, a high-frequency electric field undergoing pulse modulation is used as the high-frequency electric field, so that the dissociation and excitation of the nitrogen gas in the plasma are promoted during the application of the high-frequency electric field through pulse modulation. Therefore, by controlling with high accuracy the high-frequency electric field application time and the high-frequency electric field stop time during the pulse modulation, it is possible to control the dissociated and excited conditions of the nitrogen gas, and thereby to control the concentration distribution of the nitrogen atoms implanted into the insulation film.

At the time of pulse modulation of the high-frequency electric field, the high-frequency electric field application time is controlled. By thus controlling the high-frequency electric field application time through pulse modulation of the plasma-generating high-frequency electric field, it is possible to control the ratios of the amounts of nitrogen molecules, atomic nitrogen radicals and ions at the time of implantation of nitrogen into the insulation film, and to control with high accuracy the reaction energy at the insulation film extreme surface given to the particles. Namely, during when the high-frequency electric field is applied through pulse modulation, the nitrogen molecules are dissociated into atomic form in the plasma, and the particles are supplied with such an energy as to be implanted into the insulation film extreme surface and to perform a reaction. Besides, by controlling with high accuracy the application time of the high-frequency electric field through pulse modulation, it is possible to control the ratio between the amounts of nitrogen molecules and nitrogen atoms. Therefore, it is possible to control with high accuracy the nitriding reaction with the insulation film at the insulation film extreme surface, by controlling the application time of the high-frequency electric field through pulse modulation.

In addition, the high-frequency electric field stop time is controlled at the time of pulse modulation of the high-frequency electric field. By thus controlling the high-frequency electric field application stop time through pulse modulation of the plasma-generating high-frequency electric field, the potential of the plasma generated by the high-frequency electric field can be controlled to a lower energy, as compared to that in the case of continuous discharge. Specifically, the plasma potential acts as an energy for implantation of nitrogen molecules and nitrogen atoms into the insulation film; therefore, by controlling the application stop time of the high-frequency electric field, it is possible to control with high accuracy the depth of the nitriding reaction at the insulation film extreme surface.

Furthermore, nitrogen atomic and molecular ions accelerated from the nitrogen plasma excited by the high-frequency electric field may be implanted into the surface of the substrate to be treated through an electrode having apertures. Thus, the present invention pertains to a plasma surface treatment system in which an electrode having a multiplicity of apertures is disposed between a plasma generated by a high-frequency electric field and a substrate to be treated, and nitrogen molecules and nitrogen atoms generated in the plasma pass through the apertures of the electrode to reach the substrate, and a plasma surface treatment method conducted by use of the system. The electrode disposed between the substrate to be treated and the plasma mitigates vacuum ultraviolet rays radiated onto the insulation film, thereby alleviating the damage to the insulation film by the vacuum ultraviolet rays. Therefore, regarding the nitriding reaction at the insulation film extreme surface, the implantation characteristic of the particles in the insulation film can be determined by the reaction energy of the particles. Besides, when the charged particles pass through the apertures of the electrode, the charged particles such as ions are neutralized through an interaction with the apertures. Therefore, the ions are not accelerated in a sheath at the substrate surface, and the particles having an excessive kinetic energy can be prevented from being implanted into the insulation film.

In addition, the discharge sustention time at the time of pulse modulation of the high-frequency electric field is in the range of from 5 to 50 $\mu$sec. With the high-frequency electric field application time thus kept at a value of not more than 50 $\mu$sec, it is possible to ensure that the energy of the nitrogen molecules and atoms implanted into the insulation film on the surface of the substrate to treated is suppressed sufficiently and that the particles are prevented from having an excessive energy for implantation and/or reaction. Besides, with the high-frequency electric field application time set to be not less than 5 $\mu$sec, it is possible to maintain such a discharge as to stably generate the plasma.

Furthermore, the duty ratio of discharge sustention time at the time of pulse modulation of the high-frequency electric field is set in the range of from 5 to 50%. With the duty ratio of discharge sustention time at the time of pulse modulation of the high-frequency electric field thus set to be not more than 50%, it is possible to maintain the density and reaction energy of nitrogen molecules and atoms at levels sufficient for reaction with the insulation film. Besides, with the duty ration set to be not less than 5%, it is possible to maintain such a discharge as to stably generate the plasma.

As has been mentioned above, according to the present invention, it is possible, in relation to the nitrogen concentration in a gate insulation film for constituting a semiconductor device, to form an oxynitride film capable of restraining the punch-through of boron from the gate electrode, without deteriorating the driving performance of transistor and without promoting the NBTI.

According to the present invention, in addition, since the concentration distribution of nitrogen atoms implanted into an insulation film can be controlled, it is possible to form an oxynitride film through implanting nitrogen into the extreme surface of an extremely thin insulation film (with a film thickness of not more than 2 nm, for example).

BRIEF DESCRIPTION OF THE DRAWINGS

The above and other objects, features and advantages of the present invention will become apparent from the following description and appended claims, taken in conjunction with the accompanying drawings, in which:

DESCRIPTION OF THE PREFERRED EMBODIMENTS

In the plasma surface treatment system according to the present invention, a high-frequency electric field is for irradiation with a plasma undergoing pulse modulation in the range of not more than 70 $\mu$sec, for example. The means for exciting the plasma is not particularly limited, inasmuch as the means is for exciting a plasma by use of a high-frequency. Examples of the exciting means include inductively coupled plasma (ICP), microwave, electron cyclotron resonance (ECR), ultra-high frequency (UHF), helicon wave, and capacitive coupling.

As the material gas for generating nitrogen molecules and atoms in plasma, there may be used not only nitrogen ($N_2$) but also ammonia ($NH_3$), and combination of nitrogen ($N_2$) with hydrogen ($H_2$), helium (He), argon (Ar), xenon (Xe), krypton (Kr) or the like.

The pulse modulation of the high-frequency electric field is conducted with a high-frequency electric field application time in the range of from 5 to 50 $\mu$sec. If the high-frequency electric field application time exceeds 50 μsec, the particles radiated from the plasma onto the surface to be treated have such an excessive energy as to nitride not only the extreme surface of the insulation film but also the semiconductor substrate. On the other hand, when the high-frequency electric field application time is less than 5 μsec, it is difficult to generate and sustain the plasma discharge stably. In addition, the duty ratio is set in the range of from 5 to 50%. If the duty ratio exceeds 50%, the particles radiated from the plasma onto the substrate to be treated have such an excessive energy as to nitride not only the extreme surface of the insulation film but also the semiconductor substrate. On the other hand, when the duty ratio is less than 5%, it is difficult to generate and sustain the plasma discharge stably.

Figure 1:
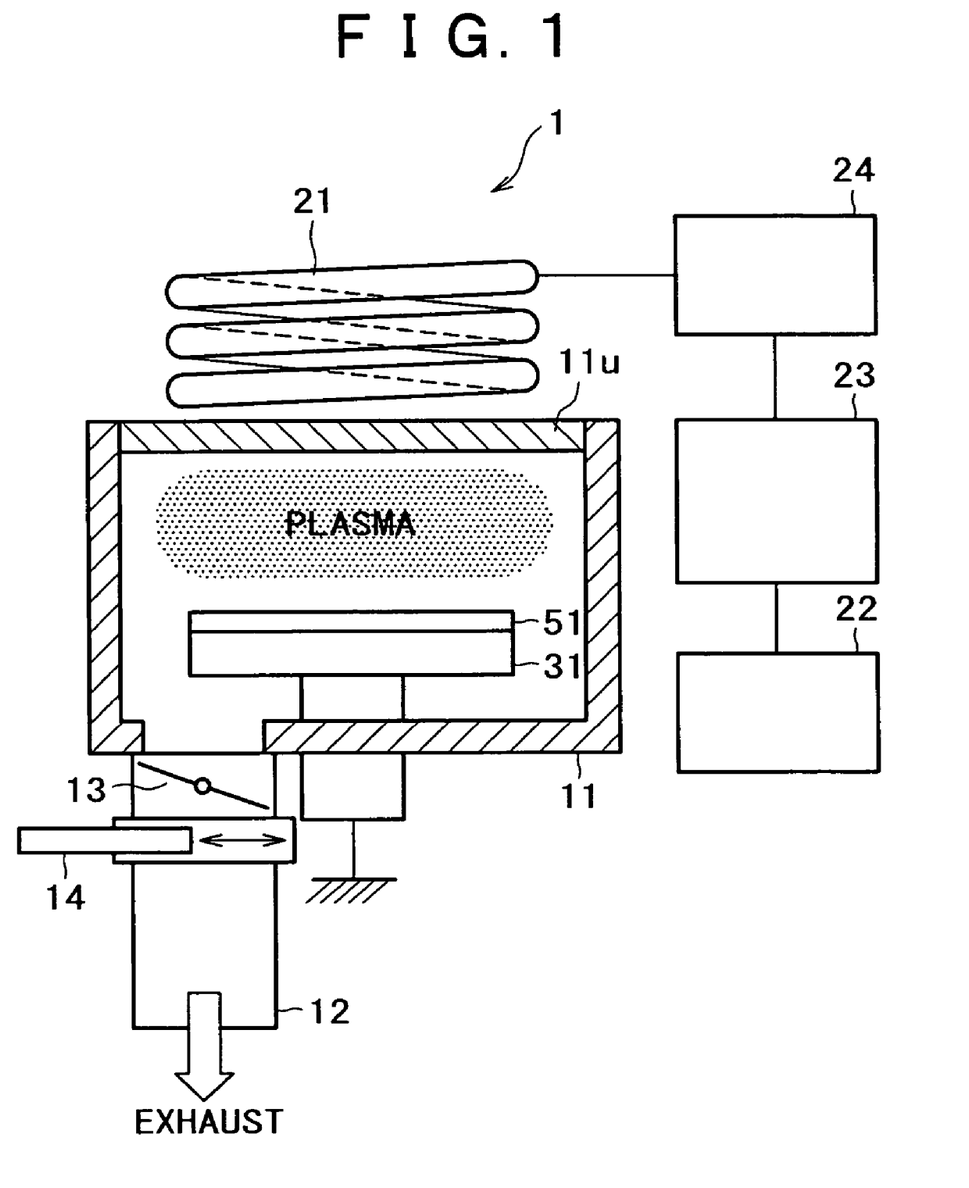
FIG. 1 is a schematic diagram showing the configuration of one embodiment of a plasma surface treatment system and a plasma surface treatment method according to the present invention.

Next, the configuration of one embodiment of the plasma surface treatment system and the plasma surface treatment method according to the present invention will be described referring the schematic diagram shown in FIG. 1. In FIG. 1, an ICP type plasma surface treatment system is schematically shown, as an example.

As shown in FIG. 1, the plasma surface treatment system 1 comprises a reaction chamber 11 for generating a plasma. An antenna 21 wound in a coil form for introducing a high-frequency electric field is disposed on a ceiling partition wall 11u formed of a ceramic (dielectric material) for functioning also as a partition wall of the reaction chamber 11. A high-frequency power source 22 is connected to the antenna 21 through a pulse modulator 23 and a matching network 24, in this order from the side of the high-frequency power source 22. The high-frequency power source 22 is for supplying a high-frequency electric power of 13.56 MHz, for example. The pulse modulator 23 is for modulating the high-frequency wave generated by the high-frequency power source 22 into a predetermined pulse. Specifically, the pulse modulator 23 is capable of controlling the high-frequency electric field application time at the time of pulse modulation of the high-frequency electric field, and is capable of controlling the high-frequency electric field stop time at the time of pulse modulation of the high-frequency electric field. The matching network 24 is for regulating the inductance of the equivalent circuit inclusive of the plasma so that the high-frequency wave is absorbed into the plasma, and specifically for regulating the capacitance and the reactance; it is preferable to provide the matching network 24.

The pulse modulator 23 is so designed, for example, that the discharge sustention time at the time of pulse modulation of the high-frequency electric field is in the range of from 5 to 50 μsec and that the duty ratio at the time of pulse modulation of the high-frequency electric field is in the range of from 5 to 50%.

Further, in the inside of the reaction chamber 11, a stage 31 on which to mount a substrate to be treated 51 to be irradiated with the plasma is disposed on the lower side of the antenna 21, with the ceiling partition wall 11u therebetween. The stage 31 is earthed. In addition, the reaction chamber 11 is provided with an exhaust unit 12 for exhausting the gas from the reaction chamber 11 or for discharging the gas from the reaction chamber 11 so as to maintain a fixed-pressure atmosphere. The exhaust unit 12 is connected to an exhaust pump (not shown) through a pressure control valve 13, a gate valve 14 and the like.

In the plasma surface treatment system 1, a gas consisting mainly of nitrogen gas is introduced into the reaction chamber 11 provided with a high-vacuum atmosphere, a high-frequency electric field is pulse-modulated by the pulse modulator 23 for pulse modulation of the high-frequency electric field, and application and stop of the high-frequency electric field are alternately repeated, whereby the density of the nitrogen plasma at the time of implanting nitrogen into an insulation film can be controlled with high accuracy. Specifically, since the dissociation and excitation of the nitrogen gas in the plasma are promoted during the application of the high-frequency electric field through pulse modulation, by controlling with high accuracy the high-frequency electric field application time and the high-frequency electric field stop time during the pulse modulation it is possible to control the dissociated and excited conditions of the nitrogen gas and, hence, to control the concentration distribution of nitrogen atoms implanted into the insulation film.

Since the pulse modulator 23 is capable of controlling the high-frequency electric field application time at the time of pulse modulation of the high-frequency electric field, by pulse-modulating the plasma-generating high-frequency electric field and controlling the application time of the high-frequency electric field it is possible to control the ratios of the amounts of nitrogen molecules, atomic nitrogen radicals and ions at the time of implantation of nitrogen into the insulation film, and to control with high accuracy the reaction energy at the insulation film extreme surface given to the particles. Specifically, during when the high-frequency electric field is applied through pulse modulation, the nitrogen molecules are dissociated into atomic form, and the particles are supplied with such an energy as to be implanted into the insulation film extreme surface and to perform a reaction. By controlling with high accuracy the application time of the high-frequency electric field through pulse modulation, it is possible to control the ratio between the amounts of nitrogen molecules and nitrogen atoms. Therefore, the nitriding reaction with the insulation film at the insulation film extreme surface, i.e., the concentration and the depth of nitriding, can be controlled with high accuracy, by regulating the application time of the high-frequency electric field through pulse modulation.

In addition, since the pulse modulator 23 is capable of controlling the high-frequency electric field stop time at the time of pulse modulation of the high-frequency electric field, by pulse-modulating the plasma-generating high-frequency electric field and thereby controlling the application stop time of the high-frequency electric field it is possible to control the potential of the plasma generated by the high-frequency electric field to a lower energy, as compared to that in the case of continuous discharge. Since the plasma potential acts as an energy for implanting nitrogen molecules and nitrogen atoms into the insulation film, by controlling the application stop time of the high-frequency electric field it is possible to control with high accuracy the depth of the nitriding reaction in the insulation film extreme surface.

Next, one example of nitriding the surface of a silicon oxide film by use of the above-described plasma surface treatment system 1 will be described below.

As the substrate to be treated 51, which is to be subjected to a nitriding treatment, a silicon substrate subjected to RCA cleaning, for example, and then processed by a thermal oxidizing method, for example, to form thereon an oxide film 2.0 nm in thickness, was used.

The reaction chamber 11 shown in FIG. 1 was supplied with nitrogen ($N_2$) gas at a flow rate of 40 ml/min, and a pressure control was conducted by the pressure control valve so as to obtain a pressure of 5.33 Pa in the reaction chamber 11. The substrate to be treated 51 was mounted and held on the stage 21, with its temperature being controlled to 20° C.

by a closed-loop technique so as to obviate an excessive rise in temperature upon irradiation with the plasma.

Figure 2:
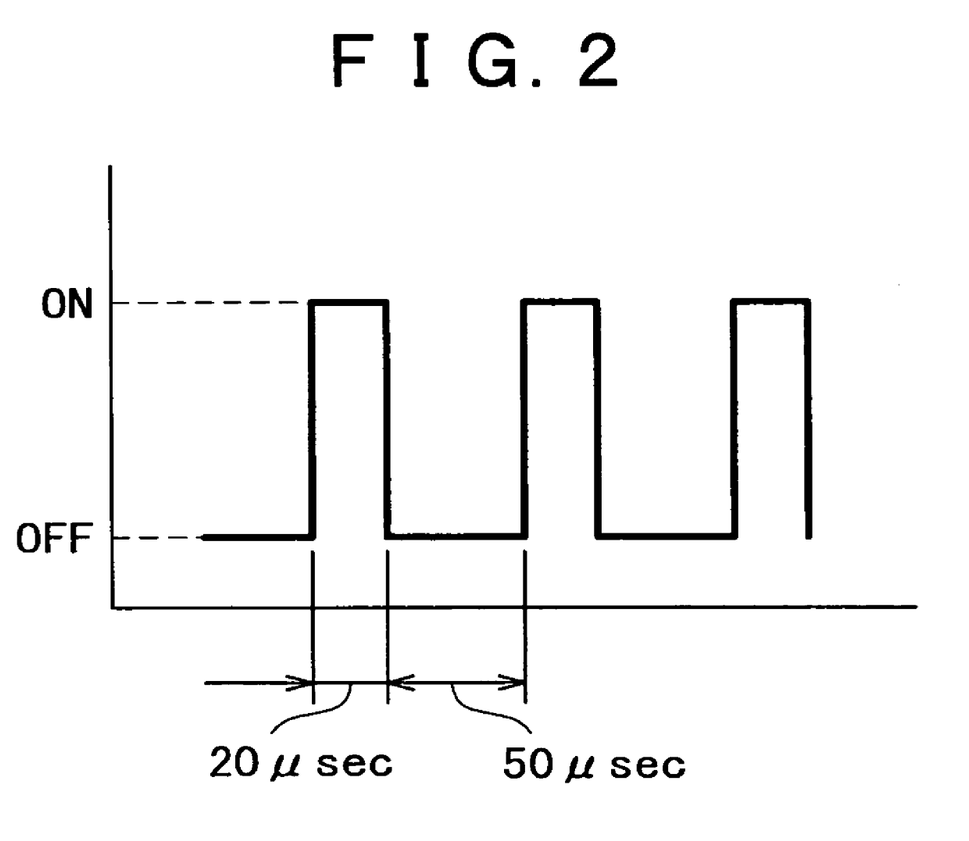
FIG. 2 is a graph showing one example of pulse modulation time of a high-frequency power.

The thermal oxide film formed on the surface of the substrate to be treated 51 was nitrided under the following process conditions. Namely, as one example of process conditions, there was used a combination of a high-frequency power of 13.56 MHz and 500 W, a pulse modulation time of the high-frequency power of 70 µsec, a high-frequency application time of 20 µsec, a high-frequency stop time of 50 µsec, a gas of nitrogen ($N_2$), a gas flow rate of 40 ml/min, a pressure in the reaction chamber of 5.33 Pa, a process time of 120 sec, and a stage temperature of 20° C. Therefore, as an example, the pulse generated by the high-frequency pulse generator is a pulse having a pulse modulation time of the high-frequency power of 70 µsec, a high-frequency application time (ON) of 20 µsec, and a high-frequency stop time (OFF) of 50 µsec, as shown in FIG. 2.

Figure 3:
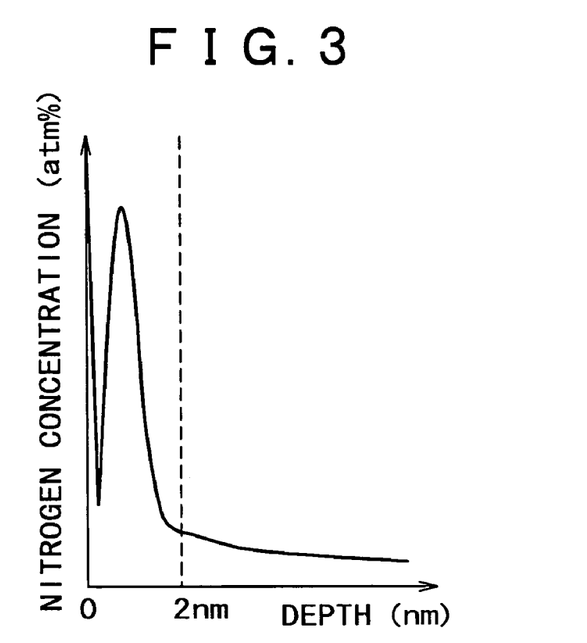
FIG. 3 is a diagram showing the relationship between nitrogen concentration and the depth from the surface of a silicon oxide film, obtained by SIMS analysis.

Next, in order to confirm the effects of the nitriding of the substrate 51 nitrided under the above-mentioned conditions, the nitrogen concentration in the insulation film on the surface of the substrate 51 thus treated was analyzed by SIMS. The results are indicated by the solid line in FIG. 3.

Besides, for comparison with continuous discharge, an oxynitride film was formed under the following process conditions, and an SIMS analysis (secondary-ion mass spectrometer) was carried out in the same manner as above. Namely, as an example of the process conditions of the treatment by continuous discharge, there was used a combination of a high-frequency power of 13.56 MHz and 500 W, a gas of nitrogen ($N_2$), a gas flow rate of 40 ml/min, a pressure in the reaction chamber of 5.33 Pa, a process time of 30 sec, and a stage temperature of 20° C.

The nitrogen concentration in the oxynitride film having undergone the continuous discharge treatment was analyzed by SIMS. The results are indicated by the dot-dash line in FIG. 4. As indicated by the solid line in FIG. 4, upon the nitriding treatment using the high-frequency pulse obtained through pulse modulation according to the present invention, the peak of nitrogen concentration was found to be on the surface side in the oxide film (2 nm in thickness). On the other hand, upon the nitriding treatment by the continuous discharge, the peak of nitrogen concentration was found to be on the substrate side in the oxide film (2 nm in thickness), as indicated by the dot-dash line in FIG. 4.

Figure 4:
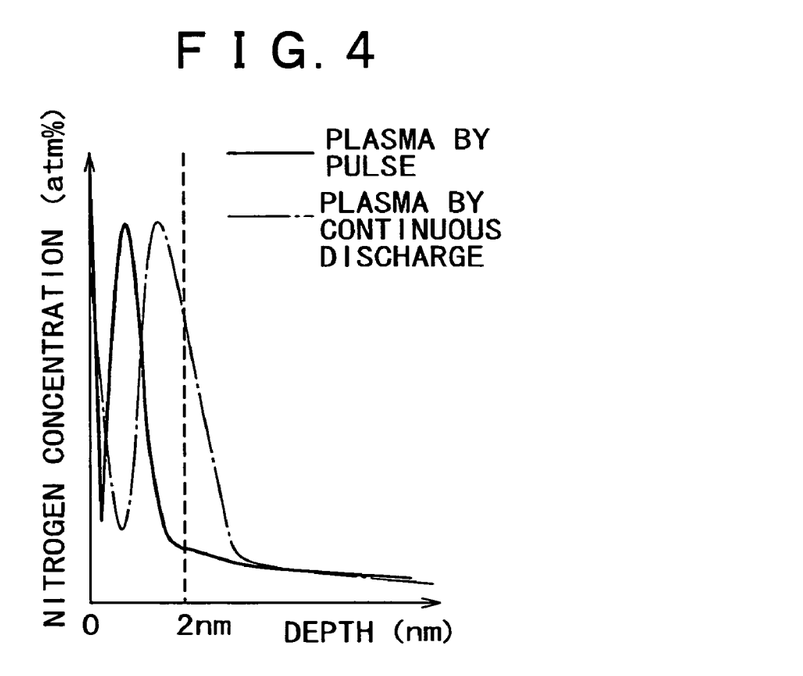
FIG. 4 is a diagram showing the relationship between nitrogen concentration and the depth from the surface of a silicon oxide film, obtained by SIMS analysis.

Thus, as is clear from the results of the SIMS analysis, the effect of the pulse modulation resides in that nitrogen can be implanted into the extreme surface of the insulation film, as compared to the case of the continuous discharge treatment. In addition, an prolongation of the process time to four times that in the case of the continuous discharge made it possible to enhance only the implanted nitrogen concentration, without causing any change in the implantation depth of nitrogen into the insulation film.

Figure 5A:
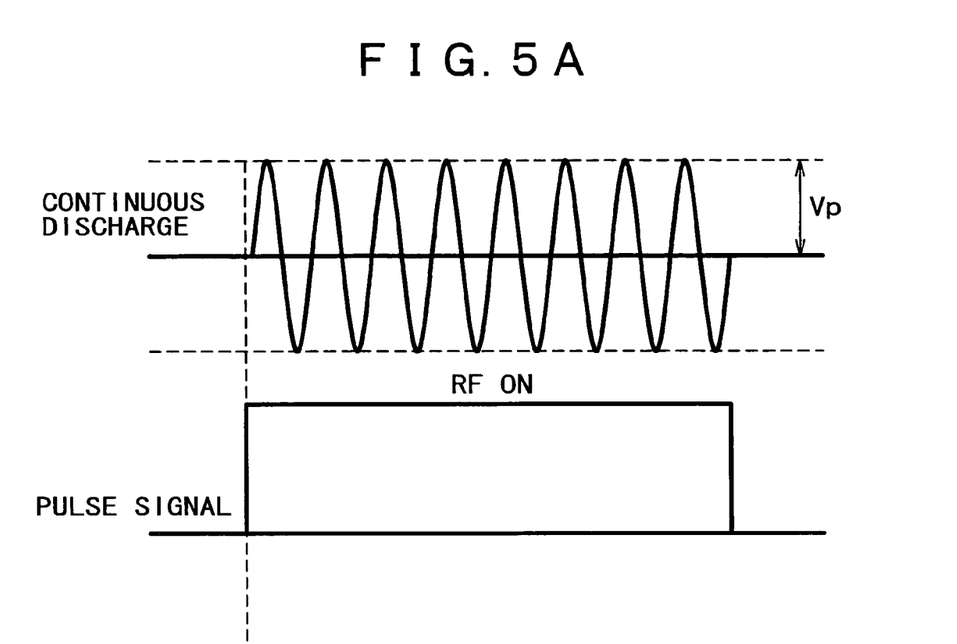
FIGS. 5A and 5B are time charts for illustrating a continuous discharged according to the prior art and a pulse discharge according to the present invention.
Figure 5B:
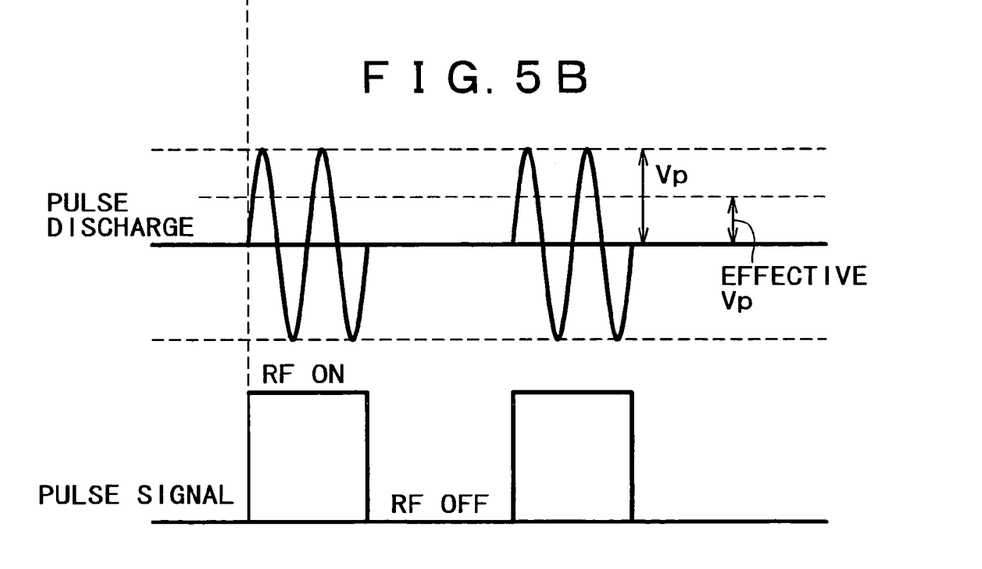

In the plasma nitrogen treatment according to the present invention, as shown in FIG. 5A, application of the high-frequency power RF using a continuous signal results in a continuous wave. In this case, the depth of nitriding is determined by the power Vp applied. For example, in the ICP plasma treatment system, the depth of nitriding can be decreased by lowering the power applied. However, it is impossible to sustain the discharge, resulting in extinction of the plasma. On the other hand, in the plasma surface treatment system (ICP plasma surface treatment system) according to the present invention, as shown in FIG. 5B, a pulse signal turns ON and OFF the high-frequency power RF, whereby a pulse wave is obtained. With the high-frequency power RF thus turned ON and OFF on a microsecond order to obtain a pulse wave, an effective Vp can be lowered without causing extinction of the plasma, even where the power applied is the same as that in the continuous discharge. This leads to a decrease in the effective energy of the plasma particles, making it possible to decrease the depth of nitriding.

Figure 6:
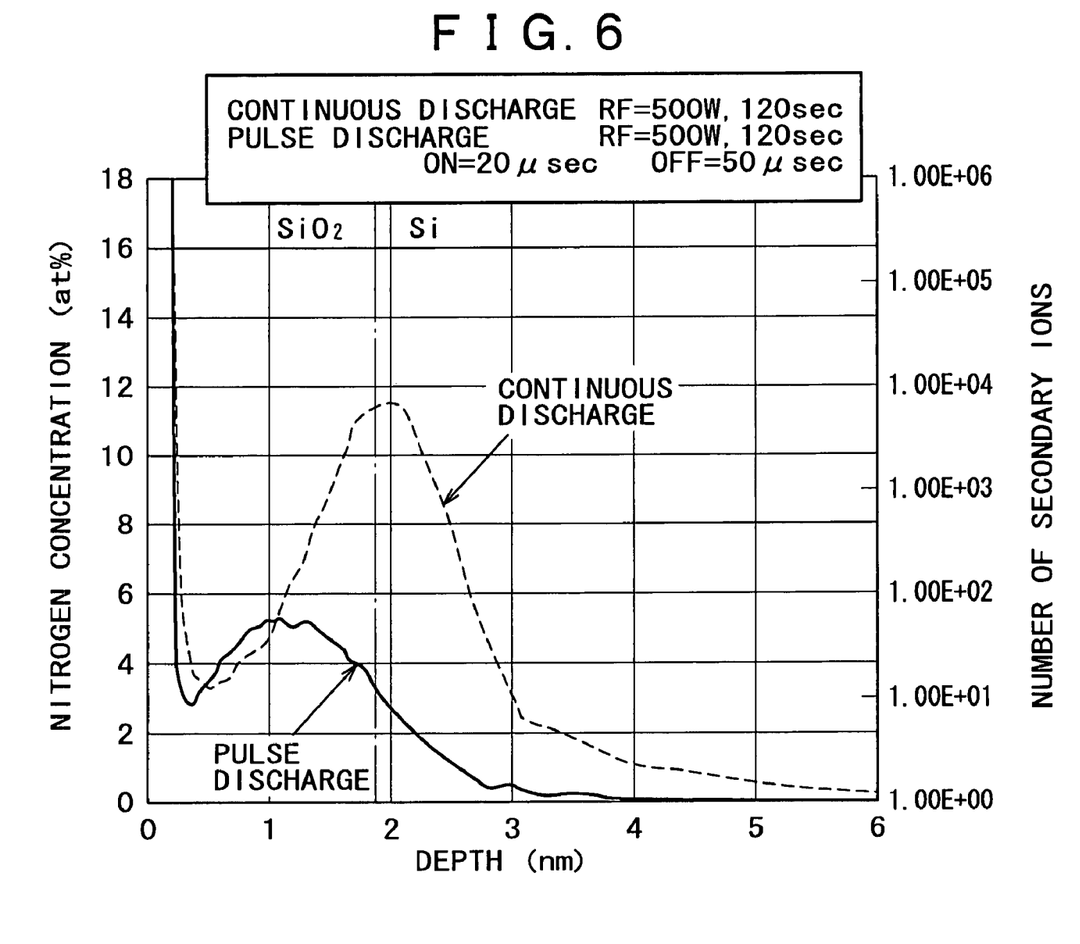
FIG. 6 is a diagram showing the relationships between nitrogen concentration, the number of secondary ions and the depth from the surface of a silicon oxide film, after a plasma nitriding treatment.

In addition, as shown in FIG. 6, where a silicon oxide ($SiO_2$) film with a thickness of 1.8 nm was formed on a silicon substrate and was nitrided, nitriding by use of continuous discharge resulted in that the peak of nitrogen concentration was present in the vicinity of the interface between the silicon oxide film and the silicon substrate. In this case, a high-frequency power of 500 W was applied continuously, and the process time was 120 sec. On the other hand, where the plasma surface treatment system according to the present invention was used and the plasma surface treatment method according to the present invention was carried out, the peak of nitrogen concentration could be generated in the silicon oxide. In this case, a high-frequency power of 500 W was used, the application time was 20 µsec, the stop time of the high-frequency power was 50 µsec, and the process time was 120 sec. Incidentally, the left axis of ordinates in FIG. 6 represents nitrogen concentration, the right axis of ordinates represents the number of secondary ions, and the axis of abscissas represents the depth from the surface of the silicon oxide film.

Figure 7:
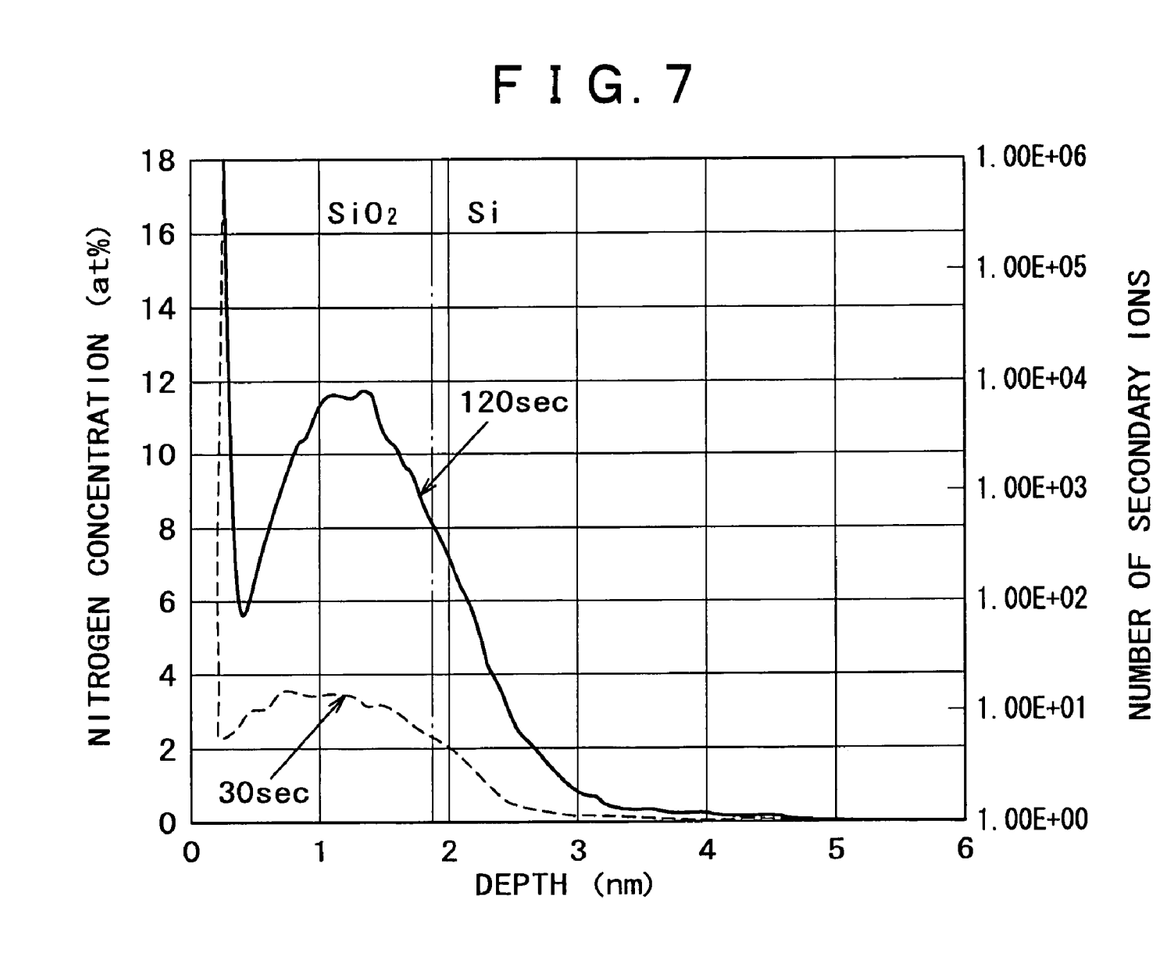
FIG. 7 is a diagram showing the relationships between nitrogen concentration, the number of secondary ions and the depth from the surface of a silicon oxide film, after a plasma nitriding treatment.

Besides, as shown in FIG. 7, where a silicon oxide ($SiO_2$) film with a thickness of 1.8 nm was formed on a silicon substrate and was nitrided by he plasma surface treatment method according to the present invention using the plasma surface treatment system according to the present invention, a prolongation of the process time resulted in that the nitrogen concentration could be enhanced without changing the position of the peak of the nitrogen concentration. In this case, a high-frequency power of 500 W was used, the application time was 20 µsec, the stop time of the high-frequency power was 50 µsec, and the process times were 30 sec and 120 sec. In FIG. 7, the left axis of ordinates represents nitrogen concentration, the right axis of ordinates represents the number of secondary ions, and the axis of abscissas represents the depth from the surface of the silicon oxide film.

Figure 8:
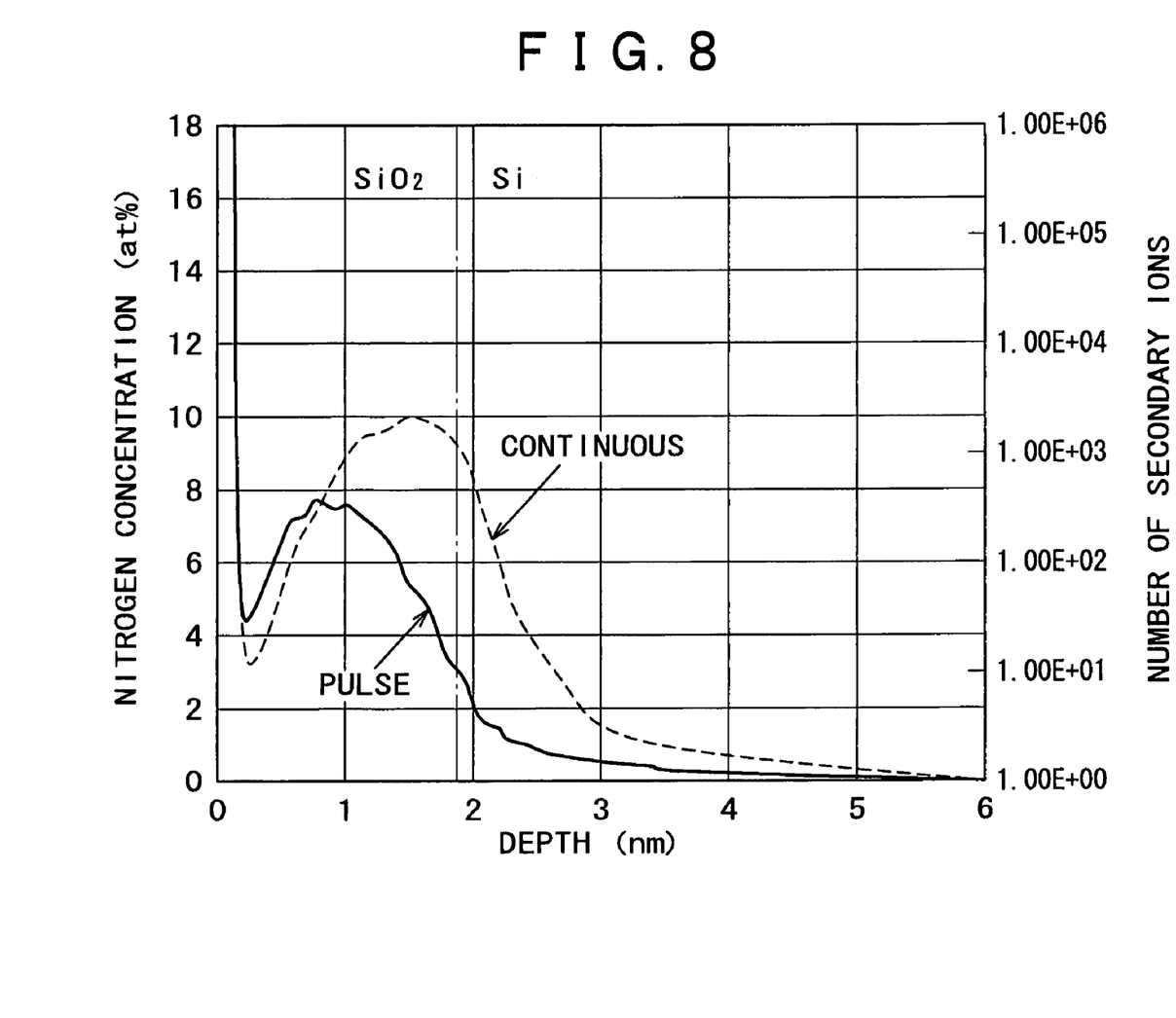
FIG. 8 is a diagram showing the relationships between nitrogen concentration, the number of secondary ions and the depth from the surface of a silicon oxide film, after a plasma nitriding treatment.

In addition, as shown in FIG. 8, where a silicon oxide ($SiO_2$) film with a thickness of 1.8 nm was formed on a silicon substrate and was nitrided by the plasma surface treatment method according to the present invention using a plasma surface treatment system of the neutral beam type comprising the pulse modulator for pulse modulation of a high-frequency electric field according to the present invention, nitriding by continuous discharge resulted in that the peak of nitrogen concentration was present at a position in the silicon oxide film close to the vicinity of the interface between the silicon oxide film and the silicon substrate. On the other hand, when the plasma surface treatment method of the present invention was carried out by use of the plasma surface treatment system according to the present invention, the peak of nitrogen concentration could be generated at a roughly central position of film thickness in the silicon oxide film. In FIG. 8, the left axis of ordinates represents nitrogen concentration, the right axis of ordinates represents the number of secondary ions, and the axis of abscissas represents the depth from the surface of the silicon oxide film.

From the foregoing, according to the plasma surface treatment system and the plasma surface treatment method of the present invention, it is possible to perform nitrising of a silicon oxide film while obtaining the peak of nitrogen concentration at a position shallower than 1.2 nm, as contrasted to that obtained by the conventional nitriding technique.

Figure 9:
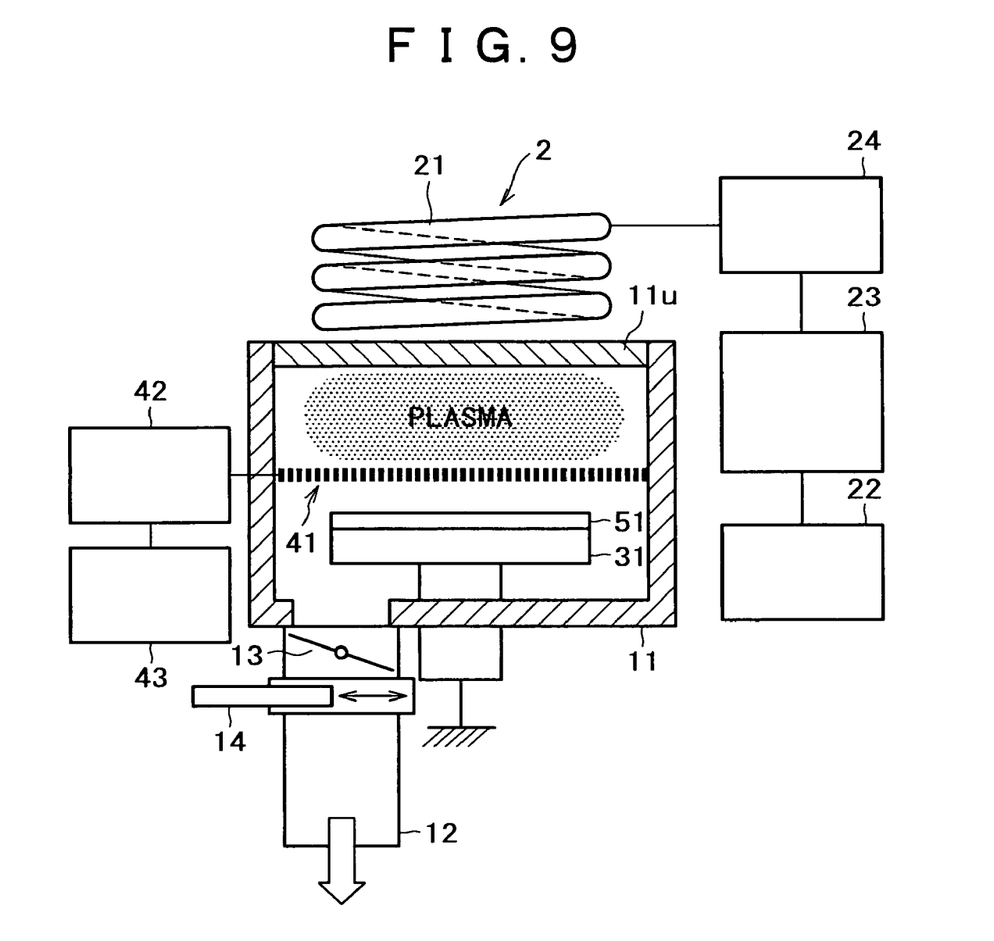
FIG. 9 is a schematic diagram showing the configuration of one embodiment of the plasma surface treatment system and the plasma surface treatment method according to the present invention.

Next, the configuration of one example of the plasma surface treatment system and the plasma surface treatment method according to the present invention will be described referring to the schematic diagram in FIG. 9. FIG. 9 shows schematically an ICP type plasma surface treatment system, as an example.

As shown in FIG. 9, the plasma surface treatment system 2 comprises a reaction chamber 11 for generating a plasma. An antenna 21 wound in a coil form for introducing a high-frequency electric field is disposed on a ceiling partition wall 11u formed of a ceramic (dielectric material) functioning also as a partition wall of the reaction chamber 11. A high-frequency power source 22 is connected to the antenna 21 through a pulse modulator 23 and a matching network 24 in this order from the side of the high-frequency power source 22. The high-frequency power source 22 is for supplying a high-frequency power of 13.56 MHz, for example, and the pulse modulator 23 is for modulating a high-frequency wave generated by the high-frequency power source 22 into a predetermined pulse. Specifically, the pulse modulator 23 is capable of controlling the high-frequency electric field application time at the time of pulse modulation of the high-frequency electric field, and is capable of controlling the high-frequency electric field stop time at the time of pulse modulation of the high-frequency electric field. The matching network 24 is for regulating the inductance of an equivalent circuit inclusive of the plasma so that the high-frequency wave is absorbed into the plasma, and specifically for regulating the capacitance and the reactance; it is preferable to provide the matching network 24.

The pulse modulator 23 is for setting the discharge sustention time at the time of pulse modulation of the high-frequency electric field in the range of from 5 to 50 μsec, for example, and for setting the duty ratio at the time of pulse modulation of the high-frequency electric field in the range of from 5 to 50%, for example.

Further, in the inside of the reaction chamber 11, a stage 31 on which to mount a substrate to be treated 51, which is to be irradiated with the plasma is disposed, on the lower side of the antenna 21, with the ceiling partition wall 11u therebetween. The stage 31 is earthed. In addition, the reaction chamber 11 is provided with an exhaust unit 12 for exhausting the gas from the reaction chamber 11 or for discharging the gas from the reaction chamber 11 so as to maintain a fixed-pressure atmosphere. The exhaust unit 12 is connected to an exhaust pump (not shown) through a pressure control valve 13, a gate valve 14 and the like.

In the inside of the reaction chamber 11, an electrode 41 having a multiplicity of apertures for applying a DC voltage for removing charged particles present in the plasma particles is disposed between the plasma generating unit and the stage 31 on which to mount the substrate to be treated 51. A DC power supply source 43 is connected to the electrode 41 through a DC bias generator 42.

In the plasma surface treatment system 2, a gas consisting mainly of nitrogen gas is introduced into the reaction chamber 11 provided with a high-vacuum atmosphere, a high-frequency electric field is pulse-modulated by the pulse modulator 23 for pulse modulation of the high-frequency electric field, and application and stop of the high-frequency electric field are alternately repeated, whereby the density of the nitrogen plasma at the time of implanting nitrogen into an insulation film can be controlled with high accuracy. Specifically, since the dissociation and excitation of the nitrogen gas in the plasma are promoted during when the high-frequency electric field is applied through pulse modulation, by controlling with high accuracy the high-frequency electric field application time and the high-frequency electric field stop time during pulse modulation it is possible to control the dissociated and excited conditions of the nitrogen gas and, hence, to control the concentration distribution of nitrogen atoms implanted into the insulation film.

The pulse modulator 23 is capable of controlling the high-frequency electric field application time at the time of pulse modulation of the high-frequency electric field. By pulse-modulating the plasma-generating high-frequency electric field and controlling the application time of the high-frequency electric field, it is possible to control the ratios of the amounts of nitrogen molecules, atomic nitrogen radicals and ions at the time of implanting nitrogen into the insulation film, and to control with high accuracy the reaction energy at the insulation film extreme surface given to the particles. Namely, during when the high-frequency electric field is applied through pulse modulation, the nitrogen molecules are dissociated into atomic form in the plasma, and the particles are supplied with such an energy as to be implanted into the insulation film extreme surface and to perform a reaction. Besides, by controlling with high accuracy the application time of the high-frequency electric field through pulse modulation, it is possible to control the ratio between the amounts of the nitrogen molecules and the nitrogen atoms. Therefore, the nitriding reaction with the insulation film at the insulation film extreme surface, i.e., the concentration and the depth of nitriding, can be controlled with high accuracy by regulating the application time of the high-frequency electric field through pulse modulation.

In addition, the pulse modulator 23 is capable of controlling the high-frequency electric field stop time at the time of pulse modulation of the high-frequency electric field. By pulse-modulating the plasma-generating high-frequency electric field and controlling the application stop time of the high-frequency electric field, the potential of the plasma generated by the high-frequency electric field can be controlled to a lower energy, as compared to that in the case of continuous discharge. Since the plasma potential acts as an energy for implantation of nitrogen molecules and nitrogen atoms into the insulation film, the depth of the nitriding reaction in the insulation film extreme surface can be controlled with high accuracy by controlling the application stop time of the high-frequency electric field.

In the above configuration, furthermore, the electrode 41 having a multiplicity of apertures is disposed between the plasma generated by the high-frequency electric field and the substrate to be treated 51, so that nitrogen molecules and nitrogen atoms generated in the plasma pass through the apertures of the electrode 41 to reach the substrate to be treated 51. The electrode 41 disposed between the substrate to be treated 51 and the plasma mitigates vacuum ultraviolet rays radiated onto the insulation film (not shown) formed on the surface of the substrate to be treated 51, thereby alleviating the damage to the insulation film by the vacuum ultraviolet rays. Therefore, regarding the nitriding reaction in the insulation film extreme surface, the implantation characteristic of the particles in the insulation film can be determined by the reaction energy of the particles. In addition, when the charged particles pass through the apertures of the electrode 41, the charged particles such as ions are neutralized through an interaction with the apertures. Therefore, the ions are not accelerated in a sheath at the substrate surface, and the particles having an excessive kinetic energy can be prevented from being implanted into the insulation film.

Next, one example of nitriding the surface of a silicon oxide film by use of the above-described plasma surface treatment system 2 will be described below.

As the substrate to be treated 51, which is to be subjected to the nitriding treatment, a silicon substrate subjected to RCA cleaning, for example, and then subjected to a thermal oxidizing method, for example, to form thereon an oxide film 2.0 nm in thickness, was used.

The reaction chamber 11 shown in FIG. 9 was supplied with nitrogen ($N_2$) gas at a flow rate of 40 ml/min, and a pressure control was conducted by the pressure control valve so as to obtain a pressure of 0.67 Pa in the reaction chamber 11. The substrate to be treated 51 was mounted and held on the stage 21, and a temperature was controlled to 300° C. by a closed-loop technique so that an excessive rise in temperature is not caused by irradiation with the plasma.

Figure 10:
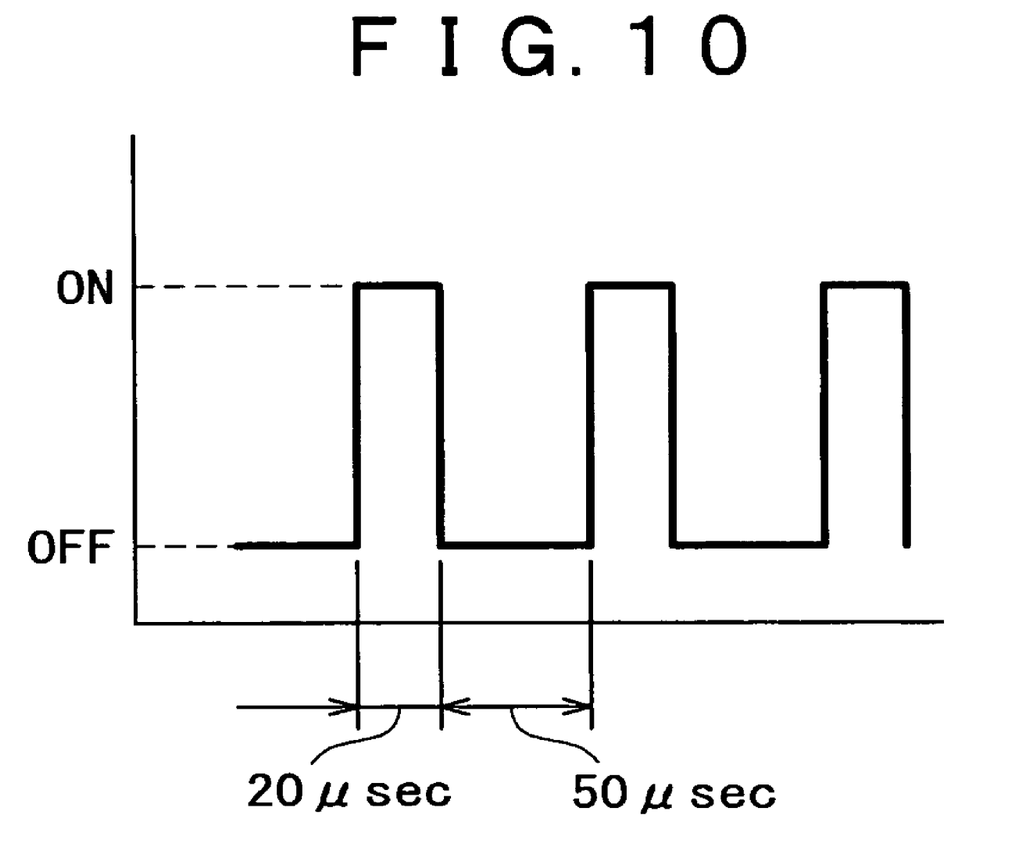
FIG. 10 is a graph showing one example of pulse modulation time of a high-frequency power.

The thermal oxide film formed on the surface of the substrate to be treated 51 was nitrided under the following process conditions. Namely, as an example of process conditions, there was used a combination of a high-frequency power of 13.56 MHz and 250 W, a pulse modulation time of the high-frequency power of 70 $\mu$sec, a high-frequency application time of 20 $\mu$sec, a high-frequency stop time of 50 $\mu$sec, a DC voltage of the apertured electrode of +10 V, a gas of nitrogen ($N_2$), a gas flow rate of 40 ml/min, a pressure in the reaction chamber of 0.67 Pa, a process time of 120 sec, and a stage temperature of 300° C. Therefore, an example of the pulse generated by the high-frequency pulse generator 13 is a pulse as shown in FIG. 10, in which the pulse modulation time of the high-frequency power is 70 $\mu$sec, the high-frequency application time (ON) is 20 $\mu$sec, and the high-frequency stop time (OFF) is 50 $\mu$sec.

Figure 11:
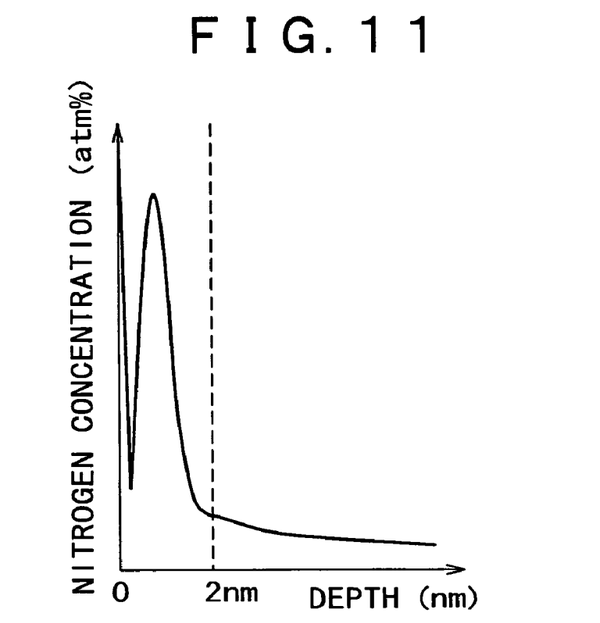
FIG. 11 is a diagram showing the relationship between nitrogen concentration and the depth from the surface of a silicon oxide film, obtained by SIMS analysis.

Next, in order to confirm the effect of the nitriding of the substrate performed by the nitriding treatment under the above-mentioned process conditions, the nitrogen concentration in the insulation film on the surface of the substrate 51 thus treated was analyzed by SIMS. The results are indicated by the solid line in FIG. 11.

In addition, for comparison with continuous discharge, an oxynitride film was formed under the following process conditions, and an SIMS analysis (secondary-ion mass spectrometer) was carried out in the same manner as above. Namely, as an example of the process conditions of the treatment by continuous discharge, there was used a combination of a high-frequency power of 13.56 MHz and 250 W, a DV voltage of the apertured electrode of +10 V, a gas of nitrogen ($N_2$), a gas flow rate of 40 ml/min, a pressure in the reaction chamber of 0.67 Pa, a process time of 30 sec, and a stage temperature of 300° C.

The nitrogen concentration in the oxynitride film obtained by the continuous discharge treatment was analyzed by SIMS. The results are indicated by the dot-dash line in FIG. 12. As indicated by the solid line in FIG. 12, upon the nitriding treatment using the high-frequency pulse obtained through pulse modulation according to the present invention, the peak of nitrogen concentration was found to be present on the surface side in the oxide film (2 nm in thickness). On the other hand, upon the nitriding treatment by continuous discharge, the peak of nitrogen concentration was found to be present on the substrate side in the oxide film (2 nm in thickness), as indicated by the dot-dash line in FIG. 12.

Figure 12:
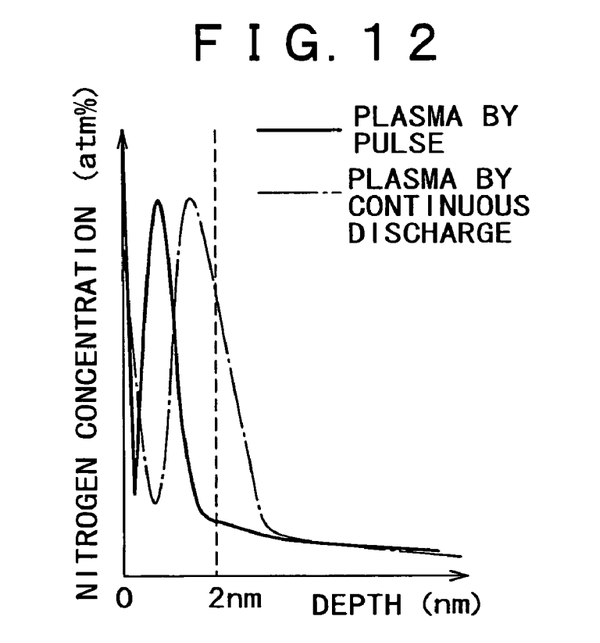
FIG. 12 is a diagram showing the relationship between nitrogen concentration and the depth from the surface of a silicon oxide film, obtained by SIMS analysis.

Thus, as is clear from the results of the SIMS analysis, the effect of the pulse modulation resides in that nitrogen can be implanted into the extreme surface of the insulation film, as contrasted to the continuous discharge treatment. Besides, a prolongation of the process time to four times that in the case of the continuous discharge made it possible to enhance only the implanted nitrogen concentration, without causing any change in the implantation depth of nitrogen into the insulation film.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A plasma surface treatment system for irradiating a surface of a substrate to be treated with a nitrogen plasma excited by a high-frequency electric field to introduce nitrogen into said surface of said substrate, wherein
    said system comprises a pulse modulator for pulse modulation of said high-frequency electric field, wherein said pulse modulator is a pulse modulator capable of controlling the high-frequency electric field application time at the time of pulse modulation of said high-frequency electric field.

2. A plasma surface treatment system as set forth in claim 1, wherein
    said pulse modulator is a pulse modulator capable of controlling the high-frequency electric field stop time at the time of pulse modulation of said high-frequency electric field.

3. A plasma surface treatment system as set forth in claim 1, wherein
    an electrode having apertures for mitigating vacuum ultraviolet rays is provided between said nitrogen plasma excited by said high-frequency electric field and said substrate to be treated.

4. A plasma surface treatment method for irradiating a surface of a substrate to be treated with a nitrogen plasma excited by a high-frequency electric field to introduce nitrogen into said surface of said substrate, wherein
    a high-frequency electric field undergoing pulse modulation is used as said high-frequency electric field, wherein the high-frequency electric field application time is controlled at the time of pulse modulation of said high-frequency electric field.

5. A plasma surface treatment method as set forth in claim 4, wherein
    the high-frequency electric field stop time is controlled at the time of pulse modulation of said high-frequency electric field.

6. A plasma surface treatment method as set forth in claim 4, wherein
    nitrogen atomic and molecular ions accelerated from said nitrogen plasma excited by said high-frequency electric field are implanted into said surface of said substrate to be treated through an electrode having apertures.

7. A plasma surface treatment method as set forth in claim 4, wherein
    the discharge sustention time at the time of pulse modulation of said high-frequency electric field is in the range of from 5 to 50 $\mu$sec.

8. A plasma surface treatment method as set forth in claim 4, wherein
    the duty ratio at the time of pulse modulation of said high-frequency electric field is in the range of from 5 to 50%.

* * * * *